United States Patent
Udagawa

(10) Patent No.: US 8,216,367 B2
(45) Date of Patent: Jul. 10, 2012

(54) METHOD FOR PRODUCTION OF SILICON CARBIDE LAYER, GALLIUM NITRIDE SEMICONDUCTOR DEVICE AND SILICON SUBSTRATE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 917 days.

(21) Appl. No.: 11/921,929

(22) PCT Filed: May 23, 2006

(86) PCT No.: PCT/JP2006/310614
§ 371 (c)(1),
(2), (4) Date: Sep. 4, 2008

(87) PCT Pub. No.: WO2006/134765
PCT Pub. Date: Dec. 21, 2006

(65) Prior Publication Data
US 2009/0045412 A1   Feb. 19, 2009

Related U.S. Application Data

(60) Provisional application No. 60/693,095, filed on Jun. 23, 2005.

(30) Foreign Application Priority Data

Jun. 14, 2005 (JP) ................. 2005-173209

(51) Int. Cl.
*C30B 25/02* (2006.01)

(52) U.S. Cl. .............. 117/103; 117/84; 117/88; 117/94; 117/95; 117/96; 117/97; 117/98; 117/99; 117/102; 117/104; 117/105; 117/106; 117/107; 117/108

(58) Field of Classification Search ............ 117/84, 117/88, 94–99, 102–108, 951
See application file for complete search history.

(56) References Cited

U.S. PATENT DOCUMENTS

| | | | |
|---|---|---|---|
| 5,492,752 A | 2/1996 | Parsons et al. | |
| 5,653,798 A | 8/1997 | Parsons et al. | |
| 5,786,606 A * | 7/1998 | Nishio et al. | .......... 257/103 |
| 6,530,991 B2 | 3/2003 | Tanaka et al. | |

(Continued)

FOREIGN PATENT DOCUMENTS

| EP | 1109208 A2 | 6/2001 |
|---|---|---|
| JP | 3-173418 A | 7/1991 |

(Continued)

OTHER PUBLICATIONS

T. Kikuchi, et al. "3C-SiC/Si template growth and atomic layer epitaxy of cubic GaN by RF-MBE," J. Cryst. Growth, 275, p. e1215, available online Jan. 18, 2005.*

(Continued)

*Primary Examiner* — Michael Kornakov
*Assistant Examiner* — Kenneth A Bratland, Jr.
(74) *Attorney, Agent, or Firm* — Sughrue Mion, PLLC

(57) ABSTRACT

A method for producing a silicon carbide layer on a surface of a silicon substrate includes the step of irradiating the surface of the silicon substrate heated in a high vacuum at a temperature in a range of from 500° C. to 1050° C. with a hydrocarbon-based gas as well as an electron beam to form a cubic silicon carbide layer on the silicon substrate surface.

4 Claims, 1 Drawing Sheet

U.S. PATENT DOCUMENTS

| | | |
|---|---|---|
| 6,569,249 B1 | 5/2003 | Singh et al. |
| 6,686,264 B2 | 2/2004 | Lucovsky |
| 6,902,771 B2 | 6/2005 | Shiota et al. |
| 2003/0012984 A1 | 1/2003 | Ueda |

FOREIGN PATENT DOCUMENTS

| | | |
|---|---|---|
| JP | 5-24999 A | 2/1993 |
| JP | 8-509575 A | 10/1996 |
| JP | 11204404 A | 7/1999 |
| JP | 11204440 A | 7/1999 |
| JP | 2002241192 | 8/2002 |
| JP | 2003086520 A | 3/2003 |
| JP | 4084541 B2 | 2/2008 |
| TW | 502287 | 9/2002 |
| TW | 541600 | 7/2003 |
| TW | 548236 | 8/2003 |
| TW | 575908 | 2/2004 |
| WO | 9414186 A1 | 6/1994 |
| WO | 2004031457 A1 | 4/2004 |

OTHER PUBLICATIONS

Seijiro Furukawa, et al. "Silicon based hetero device," published by Kumao Ebihara in Tokyo, Japan on Jul. 30, 1991.*

Section D(1) from "Thin Film Handbook," published by the Japan Society of Applied Physics, Thin Film and Surface Physics Division on Mar. 25, 1991.*

T. Takaoka, et al. "Observation of c(4×4) LEED pattern induced by reaction of Si(100) surface with C2H4," Surf. Sci. 347, p. 105 (1996).*

T. Kikuchi et al.; "3C-SiC/Si template growth and atomic layer epitaxy of cubic GaN by RF-MBE"; Journal of Crystal Growth 275 (2005) e1215-e1221.

Thin-Film Fabrication Handbook; Japan Society of Applied Physics (Corp.)/Thin Film and Surface Physics Division; Mar. 25, 1991.

Seijiro Furukawa et al.; "Silicon Based Hetero Device"; Jul. 30, 1991.

Masanori Akasaki et al.; "Basis of Plasma Engineering (Revised Version)"; Sep. 28, 1994.

Yuri M. Tairov; "SiC Boule Growth"; Electric Refractory Materials; 2000.

Tetsuya Takeuchi et al., "Growth of single crystalline GaN film on Si substrate using 3C-SiC as an intermediate layer"; Journal of Crystal Growth; vol. 115, No. 1/04; Dec. 2, 1991; pp. 634-638; XP000322868.

* cited by examiner

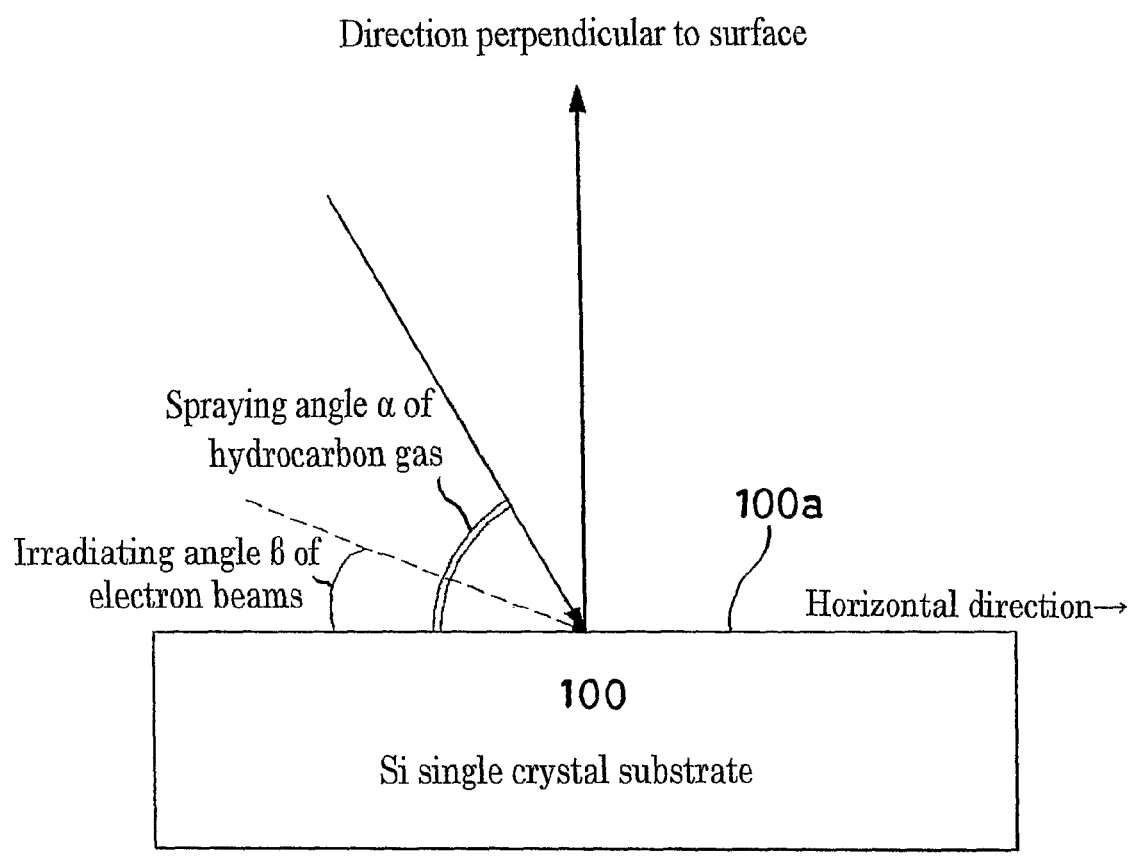

METHOD FOR PRODUCTION OF SILICON CARBIDE LAYER, GALLIUM NITRIDE SEMICONDUCTOR DEVICE AND SILICON SUBSTRATE

CROSS REFERENCE TO RELATED APPLICATIONS

This application is a §371 of PCT/JP2006/310614 filed May 23, 2006, claiming the benefit of Provisional Application No. 60/693,095 filed Jun. 23, 2005 and Japanese Patent Application No. 2005-173209 filed Jun. 14, 2005.

TECHNICAL FIELD

The present invention relates to a method for producing a silicon carbide layer on the surface of a silicon substrate, to a gallium nitride semiconductor device formed on the silicon carbide layer and to a silicon substrate including the silicon carbide layer.

BACKGROUND ART

As technical means for forming silicon carbide (SiC) on the surface of a silicon substrate, there has heretofore been known the Chemical Vapor Deposition (CVD) means using saturated aliphatic hydrocarbons and a homologue of silicon tetrachloride as raw materials. For example, a technique for growing an SiC film on the surface of an Si substrate through the CVD method using propane ($C_3H_8$) and trichlorosilane ($SiHCl_3$) as raw materials (refer, for example, to "Silicon-based Heterodevice," Seijiro Furukawa & Yoshihito Amamiya, Maruzen Co., Ltd., Jul. 30, 1991, pp. 91-93).

As a simpler method for forming silicon carbide, there has heretofore been known a method of carbonizing the surface of a silicon substrate using an unsaturated hydrocarbon gas, such as acetylene ($C_2H_2$) (refer, for example, to the prior art just mentioned above). There has also been known means for forming a silicon carbide film by irradiating the surface of a substrate with an acetylene gas within a Molecular Beam Epitaxial (MBE) apparatus retained in high vacuum of $10^{-5}$ Pa to carbonize the surface of the substrate (refer, for example, to "Journal of Crystal Growth," T. Ohachi et al., the Netherlands, Vol. 275 (1-2), 2005, pp. e1215-e1221).

In the prior art means for simply carbonizing the silicon surface, however, the carbonization does not always be promoted satisfactorily homogeneously on the surface of a silicon substrate. That is to say, a silicon carbide layer having a uniform thickness cannot reliably be formed. This is problematic. A partial region of the silicon substrate surface is not coated with a silicon carbide layer, but exposed to an atmosphere. Even when such a layer inhomogeneous in configuration is used as an under layer, therefore, formation of an upper layer having a uniformly unified crystal shape will fail to produce.

A cubic silicon carbide crystal (3C—SiC; lattice constant=0.436 nm) has substantially the same lattice constant as a cubic gallium nitride crystal (GaN; lattice constant=0.451 nm). In addition, the lattice spacing of the (110) plane of a cubic silicon carbide (=0.308 nm) substantially conforms to that of the a-axis of a hexagonal GaN crystal (0.318 nm). Therefore, a cubic silicon carbide crystal layer can constitute a lattice-matched under layer for growing thereon a cubic or hexagonal gallium nitride crystal upper layer. According to the prior art techniques, however, it is impossible as described above to reliably form a silicon carbide layer uniformly coating the entire surface of the silicon substrate. For this reason, when it is intended to form a GaN layer using a silicon carbide layer excellent in lattice matching as an under layer, the silicon carbide layer cannot constitute an under layer capable of forming thereon a Group III nitride semiconductor layer having homogeneous crystalline characteristics. This is also problematic.

The present invention has been proposed in view of the above. The object of the present invention is to provide a method for producing a silicon carbide layer capable of uniformly coating the surface of a silicon substrate through irradiation of the silicon substrate surface of a gas comprising a saturated aliphatic hydrocarbon or an unsaturated hydrocarbon, provide a gallium nitride-based semiconductor device formed on the silicon carbide layer and provide a silicon substrate including the silicon carbide layer.

DISCLOSURE OF THE INVENTION

To attain the above object, the present invention provides as the first aspect thereof a method for producing a silicon carbide layer on a surface of a silicon substrate, comprising the step of irradiating the surface of the silicon substrate heated in high vacuum at a temperature in a range of from 500° C. to 1050° C. with a hydrocarbon-based gas as well as an electron beam to form a cubic silicon carbide layer on the silicon substrate surface.

In the second aspect of the invention including the first aspect, angles of irradiating with the hydrocarbon-based gas and electron beam differ from each other.

In the third aspect of the invention including the second aspect, the angle of irradiating with the hydrocarbon-based gas is larger than the angle of irradiating with the electron beam in terms of an angle of elevation relative to the surface of the silicon substrate.

In the fourth aspect of the invention including any one of the first to third aspects, the electron beam has an acceleration energy in a range of from 150 eV to 500 eV and a density in a range of from $1\times10^{11}$ electrons·cm$^{-2}$ to $5\times10^{13}$ electrons·cm$^{-2}$.

The present invention further provides as the fifth aspect thereof a gallium nitride-based semiconductor device fabricated as formed on the silicon carbide layer according to any one of the first to fourth aspects.

The present invention further provides as the sixth aspect thereof a silicon substrate having formed on a surface thereof the silicon carbide layer according to any one of the first to fourth aspects.

According to the first aspect of the invention, the surface of a silicon substrate heated in high vacuum at a temperature in a range of from 500° C. to 1050° C. is irradiated with a hydrocarbon-based gas as well as an electron beam to form a cubic silicon carbide layer on the silicon substrate surface. Since the electron beam irradiating the surface of the silicon substrate or a growing silicon carbide layer has a function to suppress formation of stacking faults or twin crystals, it is possible to stably produce high-quality cubic silicon carbide layer uniformly coating the silicon substrate surface and having few crystalline defects.

According to the second aspect of the invention, particularly, in which the substrate surface is irradiated with the hydrocarbon-based gas and electron beam at different angles, promotion of unnecessary disintegration of the silicon hydrocarbon-based gas can be avoided, and deterioration of crystallinity of the silicon carbide layer by ionized fragments can be prevented, thereby enabling a superior-quality silicon carbide layer to be formed.

According to the third aspect of the invention, particularly, in which the angle of irradiating with the hydrocarbon-based gas is larger than the angle of irradiating with the electron beam in terms of an angle of elevation relative to the surface of the silicon substrate, ionization of the hydrocarbon-based gas by collision with electrons can be suppressed and consequently damage against the silicon carbide layer by the impact of hydrocarbon ions can be reduced, thereby enabling a superior-quality silicon carbide layer to be formed.

According to the fourth aspect of the invention, particularly, in which the energy beam has an acceleration energy in a range of from 150 eV to 500 eV and a density in a range of from $1\times10^{11}$ electrons·cm$^{-2}$ to $5\times10^{13}$ electrons·cm$^{-2}$, damage of the silicon substrate surface and silicon carbide layer by electrons accelerated under high voltage to have high acceleration energy can be avoided to enable a high-quality silicon carbide layer excellent in crystallinity.

The above and other objects, characteristic features and advantages of the present invention will become apparent to those skilled in the art from the description to be given herein below with reference to the accompanying drawing.

BRIEF DESCRIPTION OF THE DRAWINGS

FIG. 1 is a schematic explanatory view showing the irradiation angle of an electron beam and the spraying angle of a hydrocarbon-based gas both relative to a substrate surface.

BEST MODE FOR CARRYING OUT THE INVENTION

A cubic silicon carbide crystal layer, particularly 3C-silicon carbide layer (SiC layer) according to the Ramsdell notation, can be formed into a silicon substrate with a surface having various crystal planes (refer to "Electric Refractory Materials," Marcel Decker, Inc., 2000, pp. 409-411). To form a 3C—SiC layer oriented in the [001] direction, it is advantageous that (001)-silicon with the (001) crystal plane as its surface be used as a substrate. To form a 3C—SiC layer oriented in the [111] direction, (111)-silicon with the (111) crystal plane as its surface is used as a substrate.

What is advantageously used to form a cubic silicon carbide crystal layer on the surface of a silicon substrate is gaseous hydrocarbon decomposed at low temperatures to produce carbon-containing fragments, which is acetylene ($C_2H_2$), for example. The easily decomposable aliphatic hydrocarbon gas is supplied into an MBE apparatus retained in high vacuum via flow rate control equipment capable of precisely controlling a microflow rate, such as a leak valve. While the hydrocarbon gas, such as acetylene, may be sprayed in the horizontal direction substantially in parallel to the surface of the silicon substrate, it is preferably sprayed at an elevation angle $\alpha$ in the range of from 30° to 90°, with the surface 100a of a substrate 100, as shown in FIG. 1. The direction at an elevation angle of 90° is a direction normal to the surface 100a of the silicon substrate 100. When the hydrocarbon gas has been sprayed not horizontally, but at the angle $\alpha$ in the above range, carbonization is facilitated to enable the efficient formation of a cubic silicon carbide crystal layer on the surface of the silicon substrate.

To form a 3C—SiC layer on the surface of a silicon substrate, the silicon substrate is heated. The heating temperature is at least more than the temperature at which the hydrocarbon gas to be used is thermally decomposed in a high vacuum of $1\times10^{-5}$ Pa or less. Generally, it is preferred that a 3C—SiC layer is formed on the silicon substrate held at a temperature of 400° C., preferably in the range of from 500° C. to 1050° C.

The formation of a 3C—SiC layer on the silicon substrate held at a high temperature exceeding 1050° C. will produce disadvantageous "warping" of the substrate due to the difference in thermal expansion coefficient between them.

By irradiation of an electron beam in addition to irradiation of hydrocarbon gas to form a 3C—SiC layer on the surface of a silicon substrate, it is made possible to form a 3C—SiC layer excellent in crystallinity. As regards the electron beam, for example, electrons thermally emitted from the surface of a metal heated in a vacuum are utilized for irradiation. To efficiently generate thermionic electrons it is expedient to use a metal having a small work function and a large emission constant (refer to "Basic Plasma Engineering" (Revised Edition), Masanori Akasaki, Katsunori Muraoka, Masao Watanabe and Kenji Hebihara, Sangyo Tosho Kabushiki Kaisha, Mar. 15, 2004, Third Copy, p. 23). To emit electrons having the density described with respect to the present invention, for example, tungsten (W) (work function=4.54 eV, emission constant=70 (refer to the aforementioned "Basic Plasma Engineering" (Revised Edition), p. 23)) is suitably used.

The status in which a 3C—SiC layer is being formed on the surface of a silicon substrate can be observed from the drawings analyzed by the Reflection High-Energy Electron Diffraction (RHEED) means, for example (refer, for example to "Thin Film Fabrication Handbook," Thin Film and Surface Physics Division, The Japan Society of Applied Physics (Kyoritsu Publishing Kabushiki Kaisha, Oct. 5, 1994, First Edition, Second Copy), p. 195). By the irradiation of electron beams, generation of stacking faults and twin crystals in a 3C—SiC layer can be suppressed to make it possible to form a superior-quality 3C—SiC layer having a low density of crystal defects including stacking faults and twin crystals. The kind and density of the crystal defects can be examined from a cross-sectional Transmission Electron Microscope (TEM) image, for example. In addition, a 3C—SiC layer having an unified crystalline orientation can be formed. The orientation can be examined by analyzing means, such as the X-Ray Diffraction (XRD) method, for example.

The angle $\beta$ at which the electron beams are irradiated, as shown in FIG. 1, is smaller than the angle $\alpha$ at which the hydrocarbon gas is irradiated. That is to say, the electron beams are irradiated at a smaller elevation angle than the hydrocarbon gas, with the surface of the silicon substrate. Though the angle of irradiation of the electron beams may be identical to or larger than the angle of irradiation of the hydrocarbon gas, the electrons irradiated enter more deeply to possibly damage the region in the vicinity of the surface of the silicon substrate that constitutes a base body of the 3C—SiC layer, thereby deteriorating the quality of the crystal as the base body. This is unfavorable. The desirable angle $\beta$ of irradiation of the electron beams is an elevation angle in the range of from 5° to 75°, with the surface of the silicon substrate (Si substrate) as the standard (horizontal standard), more preferably in the range of from 10° to 45°. It is preferred that the electron beams are irradiated over the substantially entire surface of the Si substrate by means of rotating the Si substrate or deflecting the irradiation direction.

The electrons to be irradiated onto the surface of the Si substrate are generated through application of high voltage to metal, metal oxide or metal carbide material. To a metal allowed to emit thermionic electrons voltage different in potential by minus (−) 100 V, more preferably −150 to −500 V from the electrically grounded Si substrate is applied. That is to say, the acceleration energy of the electrons irradiated is suitably in the range of from 150 eV to 500 eV. It does not matter that the time of irradiating the electron beams is limited to the initial stage of growing the SiC layer. Though the irradiation can continue to the term in which the SiC is growing, continued irradiation of high-density electron beams over a long time will increase damage of SiC layer to possibly fail to stably form SiC layers excellent in crystallinity.

It is prescribed in the present invention that the density of the electrons irradiated onto the surface of the Si substrate for the purpose of forming a cubic SiC crystal layer is in the range of from $1\times10^{11}$ electrons·cm$^{-2}$ to $5\times10^{13}$ electrons·cm$^{-2}$ as a density per unit area. The density of the irradiated electrons can be calculated based on the value of electric current induced in a metal electrode disposed on an irradiated electron advancing path. The irradiation density (electrons/cm$^2$) can be obtained by dividing the measured value of electric current (A) by the unit charge ($1,602\times10^{19}$ coulomb (C)/ electrons). Irradiation of electrons having unnecessarily high energy is disadvantageous because damage is remarkably given to the surface of the Si substrate constituting a base body for forming a cubic SiC crystal layer even when the angle of irradiation is small as in the present invention.

When forming a cubic SiC crystal layer on an Si substrate, in addition to the irradiation of electron beams and irradiation of hydrocarbon gas, simultaneous addition of impurities adjusting the conductive type of silicon (Si) or SiC may be adopted. Adoption of the irradiation of electron beams and the addition of aluminum (Al), for example, can form a p-type SiC layer. In a Light-Emitting Diode (LED) allowing an operation current to flow perpendicularly relative to the surface of an Si substrate, for example, it is usually the case that the conductive type of an SiC layer is made identical with the conductive type of the Si substrate to electrically connect the SiC layer and the Si substrate. In a high-mobility field effect transistor allowing an operation current to flow horizontally (laterally) relative to the surface of an Si substrate, for example, a high-resistance layer into which an SiC layer formed on a high-resistance Si substrate is added with an impurity electrically compensatable can be utilized.

The present invention will be specifically described with reference to an example in which a cubic silicon carbide (SiC) layer is formed on a (001)-silicon single crystal (silicon) substrate while irradiating electron beams onto the substrate.

The (001) plane of a phosphorus (P)-doped Si single crystal substrate was treated with hydrogen fluoride (HF), then rinsed with pure water and dried. The dried substrate was transferred at room temperature via an atmosphere/vacuum load lock mechanism into a growth chamber of an MBE growth apparatus and heated to 1050° C. in a high vacuum of about $1\times10^{-7}$ Pa. The heat treatment for the substrate at the high temperature in the high vacuum was continued over several minutes, and the generation of a ($2\times2$) rearrangement structure was confirmed with an ordinary RHEED.

Thereafter, the temperature of the Si substrate was lowered to 900° C., with the degree of vacuum maintained. After the temperature of the Si substrate was stabilized, high-purity (purity: 99.9999%) acetylene ($C_2H_2$) gas was sprayed (irradiated) toward the (001) plane of the Si substrate at a flow rate of 0.2 cc/min. In consequence of the spray of the acetylene gas, the degree of vacuum in the MBE growth room was lowered to about $5\times10^{-5}$ Pa. The acetylene gas was sprayed at the elevation angle of 60° with respect to the surface of the Si substrate. The spray of the acetylene gas onto the (001) plane of the Si substrate was continued just over 10 minutes to form a silicon carbide (SiC) layer on the (001) plane of the Si substrate. It was confirmed from the RHEED image shape that the SiC layer thus formed was a cubic zinc blende crystal (3C—SiC) layer. The surface of the 3C—SiC layer was a (001) crystal plane that was the same as the surface of the Si substrate.

Simultaneously with the spray of the acetylene gas in forming the 3C—SiC layer, electron beams were irradiated on the (001) plane of the Si substrate at the elevation angle of 15° with respect to the surface of the Si substrate. The electrons were emitted from a resistive tungsten (W) coil filament heated through application of 300 V to both ends of the filament. From the fact that the value of electric current measured with the electrode disposed on the advancing path of the electron beam was 2.4 µA, the irradiation density of the electron beams was calculated to be $1.5\times10^{13}$ cm$^{-2}$. With the density maintained, the electron beams were irradiated exactly over three minutes from the initiation of the formation of the 3C—SiC layer.

Subsequently, the temperature of the Si substrate having the 3C—SiC layer formed thereon was lowered to 750° C. An Si-doped gallium nitride layer (n-type GaN layer) was then grown on the 3C—SiC layer through the MBE method. As the nitrogen source, an electrically neutral nitrogen radical extracted from nitrogen plasma excited with microwaves having a frequency of 13.56 MHz was used. The nitrogen source and molecular beams of gallium (Ga) were continuously irradiated on the surface of the 3C—SiC layer just over two hours. As a result, an n-type cubic zinc blende GaN layer having a thickness of 1.2 µm was formed. Si was doped utilizing Si molecular beams generated from a high-purity Si metal. The carrier concentration of the GaN layer was measured with an ordinary capacitance-voltage (C-V) meter to be about $3\times10^{18}$ cm$^{-3}$.

The observation from the ordinary cross-sectional TEM image revealed that the density of the {111} stacking faults and the {111} twin crystals were reduced. Particularly, the density of the {111} twin crystals was reduced to about ⅒ as compared with that of the 3C—SiC layer formed without use of electron beam irradiation.

As a comparative example, an Si single crystal substrate subjected to the surface treatment was conveyed into an MBE growth apparatus in accordance with the method described in the example described above, and a 3C—SiC layer was formed on the Si substrate using substantially the same degree of vacuum and the same temperature condition as in the example without use of electron beam irradiation.

On the 3C—SiC layer thus formed without use of electron beam irradiation unlike in the above example, an n-type GaN layer was then grown in accordance with the description in the example. The Si substrate having the GaN layer formed thereon was cooled in a vacuum to room temperature, then taken out of the MBE apparatus and observed with respect to the internal crystal structure of the 3C—SiC layer by means of the cross-sectional TEM technique.

It was found from the cross-sectional TEM image that many plane defects existed particularly in the region of junction between the (001) Si substrate and the 3C—SiC layer. In particular, the density of the {111} twin crystals was found to be about $2\times10^{12}$ cm$^{-2}$. This value was higher by about one order than that of the 3C—SiC layer of the example grown using the electron beam irradiation. This proved that the method described in the example was a valid method exhibiting the effect of producing a superior-quality 3C—SiC layer having a small density of twin crystals.

A GaN/GaInN light-emitting layer of a quantum well structure and a p-type AlGaN clad layer were stacked on each of the n-type GaN layers of the example and comparative example, and a p-side electrode and an n-side electrode were formed to fabricate light-emitting devices each comprising a gallium nitride-based semiconductor. In consequence of comparing the emission intensities, the emission intensity of the light-emitting device obtained through stacking the layers on the surface layer in the example was larger than that of the light-emitting device obtained through stacking the layers on the surface layer in the comparative example. It is conceivable that since the surface of the silicon substrate could be coated uniformly with the SiC layer in the example, the crystal defects in the entire stacked body were reduced to a great extent.

INDUSTRIAL APPLICABILITY

According to the present invention, it is possible to stably produce high-quality cubic silicon carbide layer uniformly coating the silicon substrate surface and having few crystal defects. It is also possible to avoid promotion of unnecessary disintegration of the hydrocarbon-based gas and prevent deterioration of crystallinity of the silicon carbide layer by ionized fragments, thereby enabling a superior-quality silicon carbide layer to be formed. It is further possible to suppress ionization of the hydrocarbon-based gas by collision with electrons and consequently reduce damage against the silicon carbide layer by the impact of hydrocarbon ions, thereby enabling a superior-quality silicon carbide layer to be formed. Moreover, it is possible to avoid damage of the silicon substrate surface and silicon carbide layer by electrons accelerated under high voltage to have high acceleration energy to enable a high-quality silicon carbide layer excellent in crystallinity. Therefore, the cubic silicon carbide layer of the present invention is advantageously applicable to a gallium nitride-based semiconductor device and to a silicon substrate.

The invention claimed is:

1. A method for producing a silicon carbide layer on a surface of a silicon substrate, comprising the step of:
   while irradiating the surface of the silicon substrate heated in high vacuum at a temperature in a range of from 500° C. to 1050° C. with a hydrocarbon-based gas, irradiating the entire surface of the silicon substrate with an electron beam at an angle between 10° and 45° to form a cubic silicon carbide layer on the silicon substrate surface.

2. The method according to claim 1, wherein angles of irradiating with the hydrocarbon-based gas and electron beam differ from each other.

3. The method according to claim 2, wherein the angle of irradiating with the hydrocarbon-based gas is larger than the angle of irradiating with the electron beam in terms of an angle of elevation relative to the surface of the silicon substrate.

4. The method according to claim 1, wherein the electron energy beam has an acceleration energy in a range of from 150 eV to 500 eV and a density in a range of from $1 \times 10^{11}$ electrons·cm$^{-2}$ to $5 \times 10^{13}$ electrons·cm$^{-2}$.

* * * * *